(12) United States Patent
Patti

(10) Patent No.: US 12,389,620 B2
(45) Date of Patent: Aug. 12, 2025

(54) SPLIT-GATE TRENCH MOS TRANSISTOR WITH SELF-ALIGNMENT OF GATE AND BODY REGIONS

(71) Applicant: STMicroelectronics S.r.l., Agrate Brianza (IT)

(72) Inventor: Davide Giuseppe Patti, Mascalucia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 542 days.

(21) Appl. No.: 17/553,477

(22) Filed: Dec. 16, 2021

(65) Prior Publication Data
US 2022/0208995 A1    Jun. 30, 2022

(30) Foreign Application Priority Data
Dec. 30, 2020   (IT) .................. 102020000032771

(51) Int. Cl.
| | | |
|---|---|---|
| H10D 30/01 | (2025.01) | |
| H01L 21/225 | (2006.01) | |
| H01L 21/265 | (2006.01) | |
| H10D 30/66 | (2025.01) | |
| H10D 62/17 | (2025.01) | |
| H10D 64/00 | (2025.01) | |
| H01L 21/765 | (2006.01) | |

(52) U.S. Cl.
CPC ..... *H10D 30/0297* (2025.01); *H01L 21/2253* (2013.01); *H01L 21/2652* (2013.01); *H01L 21/26586* (2013.01); *H10D 30/668* (2025.01); *H10D 62/393* (2025.01); *H10D 64/117* (2025.01); *H01L 21/765* (2013.01)

(58) Field of Classification Search
CPC .......... H01L 29/66734; H01L 29/7813; H01L 29/1095; H01L 29/407; H01L 21/2253; H01L 21/2652; H01L 21/26586; H10D 64/117; H10D 62/393; H10D 30/668
See application file for complete search history.

(56) References Cited

U.S. PATENT DOCUMENTS

| | | | |
|---|---|---|---|
| 2002/0030237 A1* | 3/2002 | Omura | H01L 29/8725 257/E21.345 |
| 2003/0062569 A1* | 4/2003 | Letavic | H10D 30/668 257/E21.345 |
| 2007/0082441 A1 | 4/2007 | Kraft et al. | |

(Continued)

FOREIGN PATENT DOCUMENTS

| | | |
|---|---|---|
| CN | 102270662 A | 12/2011 |
| CN | 105280714 A | 1/2016 |

(Continued)

*Primary Examiner* — Joseph C. Nicely
(74) *Attorney, Agent, or Firm* — Seed IP Law Group LLP

(57) ABSTRACT

A process is proposed for manufacturing an integrated device having at least one MOS transistor integrated on a die of semiconductor material. The process includes forming one or more gate trenches with corresponding field plates and gate regions. A body region is formed by implanting dopants selectively along one or more implantation directions that are tilted with respect to a front surface of the die. Moreover, a corresponding integrated device and a system comprising this integrated device are proposed.

18 Claims, 15 Drawing Sheets

(56) References Cited

U.S. PATENT DOCUMENTS

| | | | | |
|---|---|---|---|---|
| 2012/0012929 A1* | 1/2012 | Saito | ................. | H01L 29/66734 |
| | | | | 257/E29.256 |
| 2012/0018802 A1* | 1/2012 | Liu | ..................... | H10D 64/513 |
| | | | | 257/334 |
| 2013/0069147 A1* | 3/2013 | Ohta | ................... | H01L 29/0856 |
| | | | | 438/270 |
| 2016/0079374 A1* | 3/2016 | Okumura | ............. | H10D 64/117 |
| | | | | 257/330 |
| 2019/0074373 A1* | 3/2019 | Kobayashi | ........... | H10D 30/668 |
| 2021/0351289 A1* | 11/2021 | Hsieh | ................... | H10D 64/117 |
| 2022/0085208 A1* | 3/2022 | Oasa | ................ | H01L 29/41766 |

FOREIGN PATENT DOCUMENTS

| | | |
|---|---|---|
| CN | 108257869 A | 7/2018 |
| CN | 108511515 A | 9/2018 |
| CN | 111727491 A | 9/2020 |
| WO | 03/030267 A2 | 4/2003 |

* cited by examiner

SPLIT-GATE TRENCH MOS TRANSISTOR WITH SELF-ALIGNMENT OF GATE AND BODY REGIONS

BACKGROUND

Technical Field

The present disclosure relates to the field of integrated devices. More specifically, this disclosure relates to MOS transistors.

Description of the Related Art

The background of the present disclosure is hereinafter introduced with the discussion of techniques relating to its context. However, even when this discussion refers to documents, acts, artifacts and the like, it does not suggest or represent that the discussed techniques are part of the prior art or are common general knowledge in the field relevant to the present disclosure.

Integrated devices based on MOS transistors are commonly used in several applications. Particularly, the MOS transistors are among the most common components in power applications, wherein substantial amounts of electrical energy are processed; in this case, the MOS transistors are designed to operate at relatively high voltages and/or currents.

The (power) MOS transistors generally have a cellular structure. Each MOS transistor replicates a same structure throughout several cells that are formed in a same die of semiconductor material whereon the MOS transistor is integrated; the cells comprise corresponding (basic) gate regions and source regions that are connected in parallel, for example, in the form of alternated strips (providing a high ratio perimeter/area of the source regions). Moreover, the MOS transistors generally have a vertical structure. Each MOS transistor has its source regions at a front surface of the die and a (common) drain region at a back surface of the die, opposite to each other; in this way, a channel that forms in operation between the source regions and the drain region extends across the die. All of the above allows the MOS transistor to sustain both high currents (thanks its wide channel) and high voltages (thanks to its long channel) in a relatively small area of the die.

Particularly, in MOS transistors of trench-gate type the gate regions are formed in corresponding trenches extending from the front surface of the die; each trench is coated with a (relatively thin) insulating layer, and it is then filled with conductive material (such as doped polysilicon) forming the gate region. In this way, the channels of the MOS transistor are formed along (vertical) walls of the trenches.

The MOS transistors may also be provided with field plates. Each field plate comprises an (insulated) region of conductive material, arranged between a corresponding gate region and the drain region (close to the corresponding channel). In operation, the field plates are maintained at a reference voltage (or ground). The field plates reduce a gate/drain capacitance Cdg of the MOS transistor; this increases a switching frequency of the MOS transistor accordingly. Moreover, the field plates reduce a drain/source on-state, or output, resistance RDSon of the MOS transistor; this increases a Safe Operating Area (SOA) of the MOS transistor accordingly.

Particularly, in MOS transistors of split-gate (or shielded-gate) type the field plates are formed by corresponding additional gate regions (shield gates) buried in their tranches. The field plates are arranged below the corresponding actual gate regions (upper gates), which control the formation of the corresponding channels of the MOS transistor in operation as usual.

Therefore, a body region of the MOS transistor (wherein the source regions are formed) should be maintained at the same depth as the gate regions in the die as far as possible. For this purpose, after each trench has been coated with the insulating layer and filled with the doped polysilicon, the latter is etched to recess into the trench down to a level corresponding to the desired thickness of the field plate. Insulating material is then deposited over the whole die and then etched to form a (relatively thick) insulating layer in the trench, above the field plate. At this point, the trench is filled again with the doped polysilicon to form the gate region.

However, a thickness of the corresponding insulating layers between the field plates and the gate regions is subject to a (relatively large) spread due to the etching performed for their formation. Therefore, the body region and the gate regions may be at different depth in the die. This misalignment (between the body region and the gate regions) generates corresponding variations (and increase) of the gate/drain capacitance Cdg of the MOS transistor. Moreover, the same misalignment significantly increases the drain/source on-state resistance RDSon of the MOS transistor. As a consequence, the increased gate/drain capacitance Cdg reduces the switching frequency and the increased on-state resistance RDSon reduces the SOA of the MOS transistor accordingly. All of the above adversely affects performance of the MOS transistor (partially undermining the advantages provided by the split-gate structure).

BRIEF SUMMARY

A simplified summary of the present disclosure is herein presented in order to provide a basic understanding thereof; however, the sole purpose of this summary is to introduce some concepts of the disclosure in a simplified form as a prelude to its following more detailed description, and it is not to be interpreted as an identification of its key elements nor as a delineation of its scope.

In general terms, the present disclosure is based on the idea of self-aligning the body region with the gate regions.

Particularly, an aspect provides a process for manufacturing an integrated device, which comprises at least one MOS transistor integrated on a die of semiconductor material. The process comprises forming one or more gate trenches with corresponding field plates and gate regions; a body region is formed by implanting dopants selectively along one or more implantation directions that are tilted with respect to a front surface of the die.

A further aspect provides a corresponding integrated device.

A further aspect provides a system comprising at least one integrated device as above.

More specifically, one or more aspects of the present disclosure are set out in the independent claims and advantageous features thereof are set out in the dependent claims, with the wording of all the claims that is herein incorporated verbatim by reference (with any advantageous feature provided with reference to any specific aspect that applies mutatis mutandis to every other aspect).

BRIEF DESCRIPTION OF THE SEVERAL VIEWS OF THE DRAWINGS

The solution of the present disclosure, as well as further features and the advantages thereof, will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes, like value, content and representation). In this respect, it is expressly intended that the drawings are not necessary drawn to scale (with some details that may be exaggerated and/or simplified) and that, unless otherwise indicated, they are merely used to illustrate the structures and procedures described herein conceptually. Particularly.

DETAILED DESCRIPTION

Figure 1:
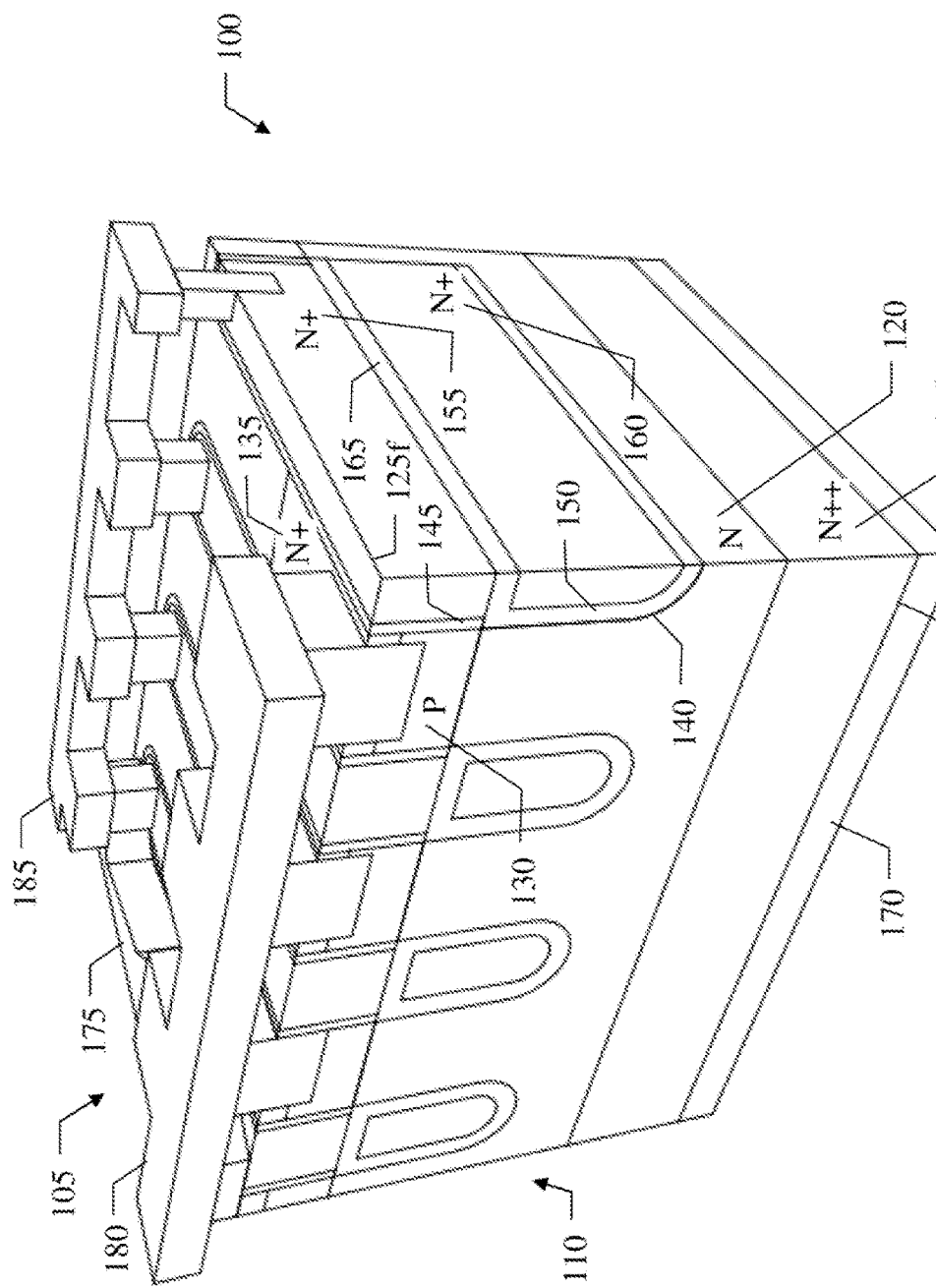
FIG. 1 shows a partial pictorial representation in cross-section view of an integrated device according to an embodiment of the present disclosure.

With reference in particular to FIG. 1, a partial pictorial representation is shown in cross-section view of an integrated device 100 according to an embodiment of the present disclosure.

The integrated device 100 comprises a MOS transistor 105 (or more). The MOS transistor 105 has a vertical structure of Split-Trench Gate (STG) type. The MOS transistor 105 implements a power component, which is designed to handle relatively high electric power (for example, of the order of more than 10 W), such as operating at corresponding relatively high currents and/or voltages (for example, of the order of more than 10 A and 10 V, respectively).

The MOS transistor 105 is integrated on a semiconductor bulk, such as a die 110 of semiconductor material, for example, silicon (so as to define a corresponding chip). As usual, the concentrations of N-type and P-type dopants (or impurities) of the semiconductor material are denoted by adding the sign + or the sign − to the letters N and P to indicate a high or low concentration of impurities, respectively, or the sign ++ or the sign −− to indicate a very high or a very low concentration of impurities, respectively; the letters N and P without the addition of any sign + or − denote concentrations of intermediate value. The die 110 comprises a substrate 115 of N++ type (far thicker in reality), over which a (thin) epitaxial layer 120 of N type is arranged. A free main surface of the epitaxial layer 120 defines a front surface 125f of the die 110, whereas a free main surface of the substrate 115 defines a back surface 125b of the die 110 (opposite to each other).

The MOS transistor 105 comprises the following components. A drain region of N++ type is defined by the substrate 115 (extending into the die 110 from the back surface 125b). A body region 130 of P type extends into the epitaxial layer 120 from the front surface 125f, so as to remain separate from the drain region 115. The MOS transistor 105 has a cellular structure, with a same structure replicated throughout a plurality of cells (such as 100-1.000). Particularly, each cell comprises the following components. A source region 135 of N+ type extends into the body region 130 from the front surface 125f. A gate trench 140 extends into the body region 130 and then into the epitaxial layer 120 from the front surface 125f. The gate trench 140 is coated with (electrically) insulating material (for example, silicon oxide); particularly, a (relatively thin) gate insulating layer 145 coats an upper portion (which may be referred to herein as an external portion) of the gate trench 140, from the front surface 120f substantially to the same depth of the body region 130, whereas a (relatively thick) separation insulating layer 150 coats a (remaining) lower portion (which may be referred to herein as an internal portion or an inner portion) of the gate trench 140. The (coated) gate trench 140 is filled with (electrically) conductive material, such as doped polysilicon of N+ type, which is split into an upper portion defining a gate region 155 and a lower portion defining a field plate (or shield gate) 160 by a (relatively thick) splitting insulating layer 165 of (electrically) insulating material (for example, silicon oxide); the splitting insulating layer 165 extends between the gate insulating layer 145 and the separation insulating layer 150, so that the gate region 155 is substantially at the same depth of the body region 130 in the die 110.

The MOS transistor 105 has an interdigitated architecture; particularly, in plant view (on the front surface 125f) the source regions 135 and the gate regions 155 have an elongated shape (strips) and are arranged parallel, alternated to each other (like fingers of crossed hands). A drain contact 170 of (electrically) conductive material (for example, metal) contacts the drain region 115. A protective layer 175 of (electrically) insulating material (for example, silicon dioxide) covers the front surface 125f (partially cut away in the figure for the sake of clarity). A source contact 180 of (electrically) conductive material (for example, metal) contacts all the source regions 135 and the body region 130 through the protective layer 175. A gate contact 185 of (electrically) conductive material (for example, metal) contacts all the gate regions 155 through the protective layer 175. A further contact (not shown in the figure) contacts all the field plates 160 (in a portion of the gate trenches 140 without the gate regions 155 and the splitting insulating layers 165, where the field plates 160 extend up to the front surface 125f).

With reference now to FIG. 2A-FIG. 2M, the main steps are shown of a manufacturing process of the integrated device according to an embodiment of the present disclosure.

Particularly, the figures are (partial) cross-section views across corresponding planes perpendicular of the front surface that extend in parallel (to the left) and transversally (to the right) with respect to longitudinal axes of the trench gates.

Figure 2A:
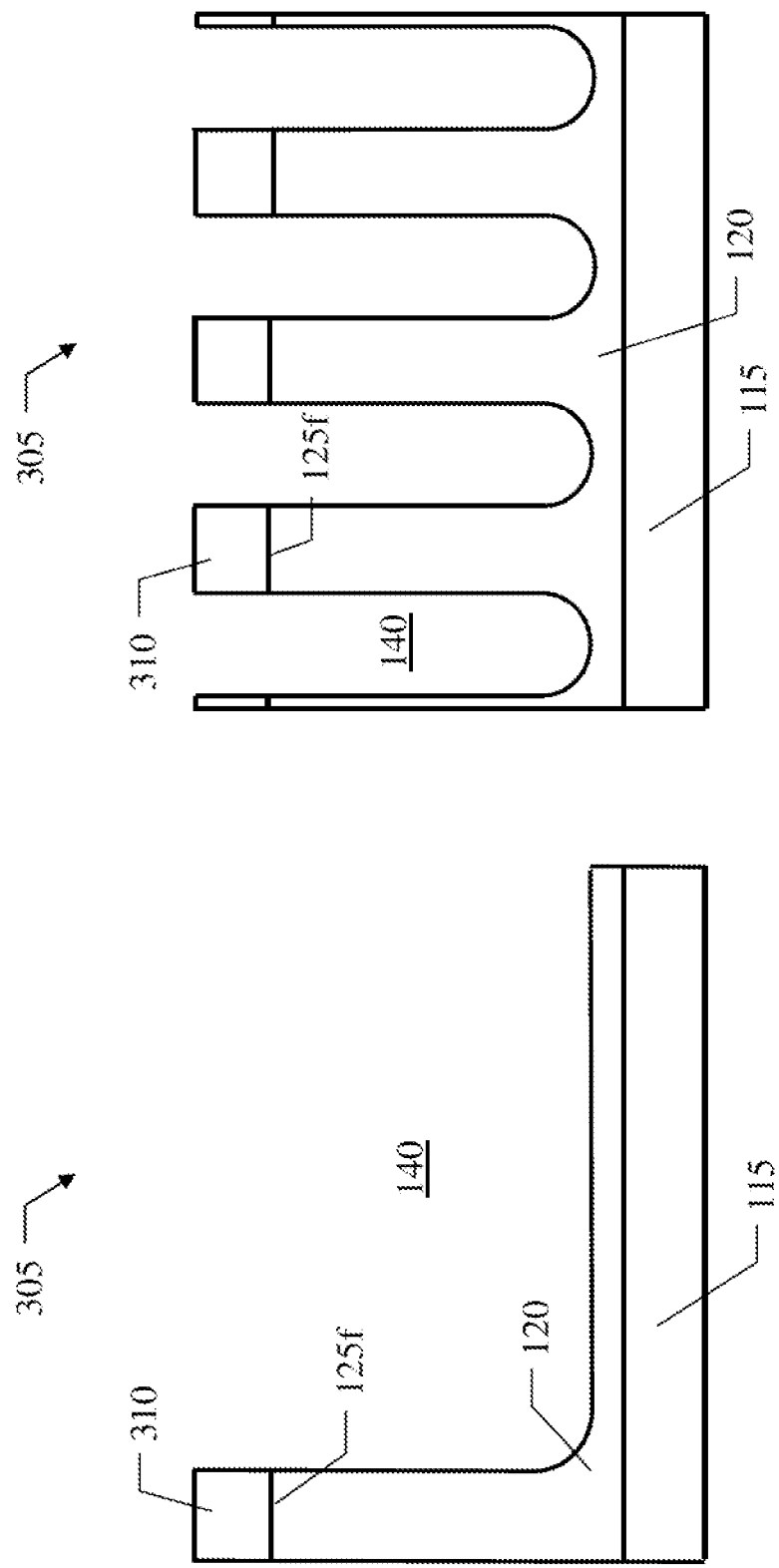
FIG. 2A-FIG. 2M show the main steps of a manufacturing process of the integrated device according to an embodiment of the present disclosure, and FIG. 3 shown a schematic block diagram of a system incorporating the integrated device according to an embodiment of the present disclosure.

Starting from FIG. 2A, as usual the manufacturing process is performed at the level of a wafer 305 of semiconductor material, whereon the same structure is integrated simultaneously in a large number of identical areas thereof (only one referred to in the following for the sake of simplicity). The wafer 305 comprises a substrate of N++ type, which will form the substrate of the integrated devices and then is denoted with the same reference 115. An epitaxial layer of N type, which will form the epitaxial layer of the integrated devices and then is denoted with the same reference 120, is grown thermally onto the substrate 115. A mask 310 for the gate trenches is formed onto a free main surface of the epitaxial layer 120, which will form the front surface of the integrated devices and then is denoted with the same reference 125f; for example, the mask 310 is obtained by growing a (relatively thick) layer of silicon oxide with a thermal oxidation step and then etching it through a photo-resist layer suitably patterned with photo-lithographic techniques (then stripped). The wafer 305 is etched through the mask 310 (for example, with a dry etching step) to form the gate trenches 140.

Figure 2B:
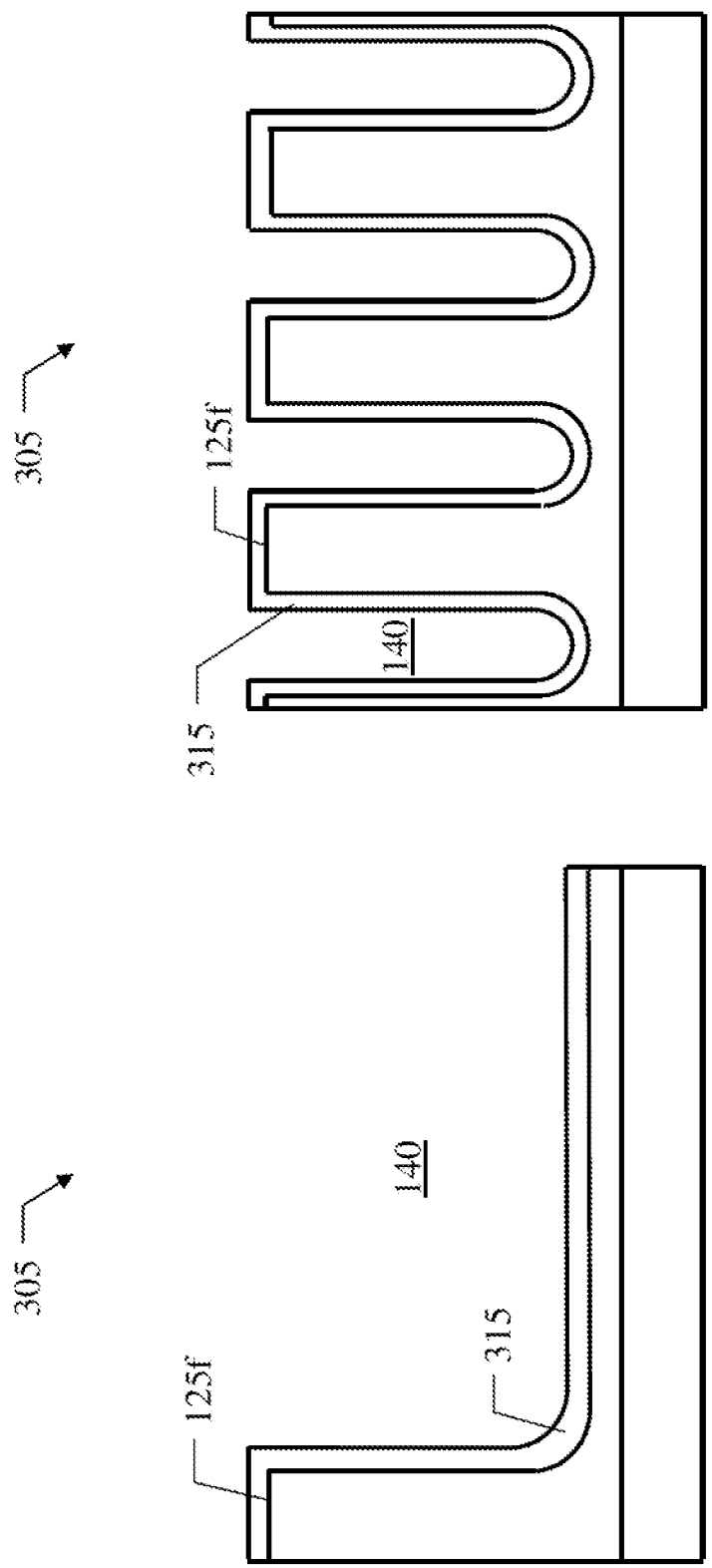

Moving to FIG. 2B, the mask is removed. A layer of silicon oxide 315 is formed onto the wafer 305, i.e., the front surface 125f and an exposed surface of the gate trenches 140 (for example, with a mixture of a thermal oxidation step and a deposition step); the layer of silicon oxide 315 is relatively thick (for example, with a thickness of 100-200 nm).

Figure 2C:
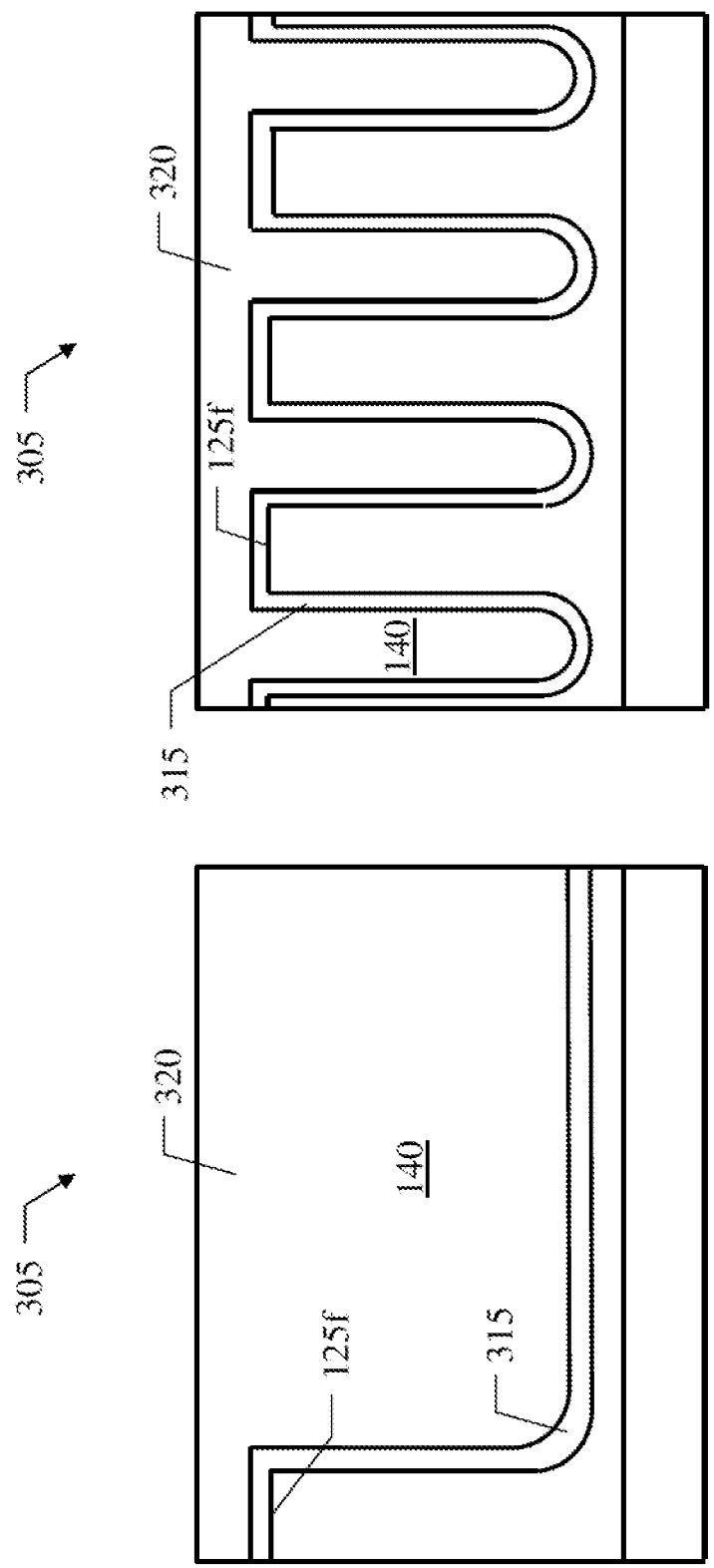

Moving to FIG. 2C, a layer of doped polysilicon 320 of N+ type is deposited onto the wafer 305, i.e., the layer of silicon oxide 315, so as to fill the (coated) gate trenches 140 and to cover the (coated) front surface 125f.

Figure 2D:
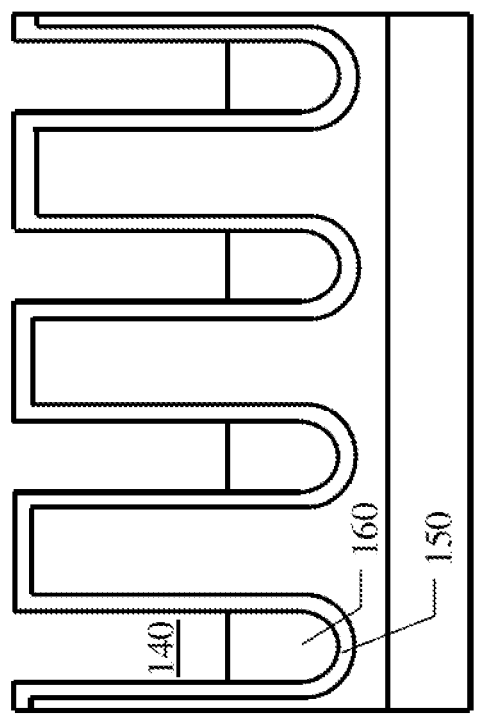
Figure 2D:
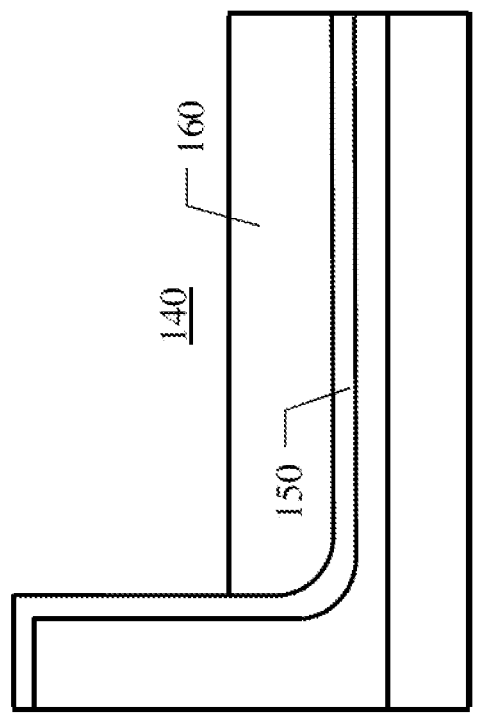

Moving to FIG. 2D, the layer of doped polysilicon is etched (for example, with a dry etching step) to recess into the gate trench 140, down to remain only in a lower portion thereof; the remaining layer of doped polysilicon then forms the field plates 160 (with a desired thickness, depending on the voltage to be sustained by the MOS transistor).

Figure 2E:
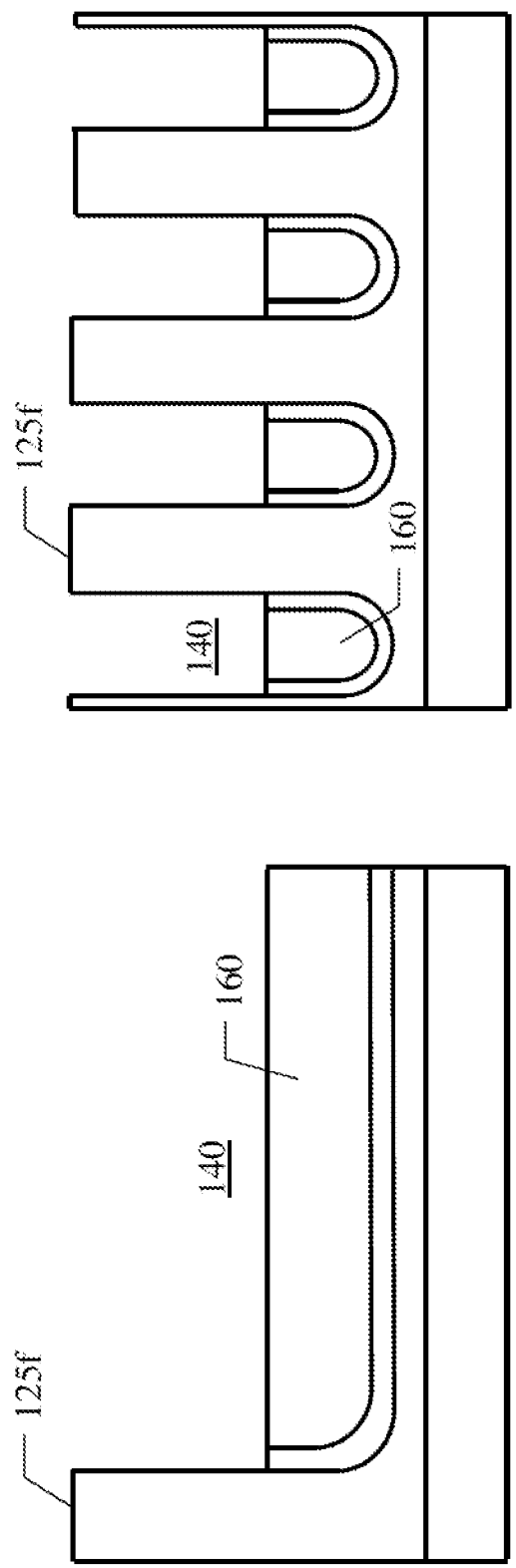

Moving to FIG. 2E, the layer of silicon oxide is etched selectively (for example, with a dry etching step); particularly, the etching only applies to an exposed portion of the layer of silicon oxide (i.e., on the front surface 125f and on a lateral surface of the upper portion of the gate trenches 140) so as to remove it. A remaining portion of the layer of silicon oxide (protected by the field plates 160) then defines the corresponding separation insulating layers 150.

Figure 2F:
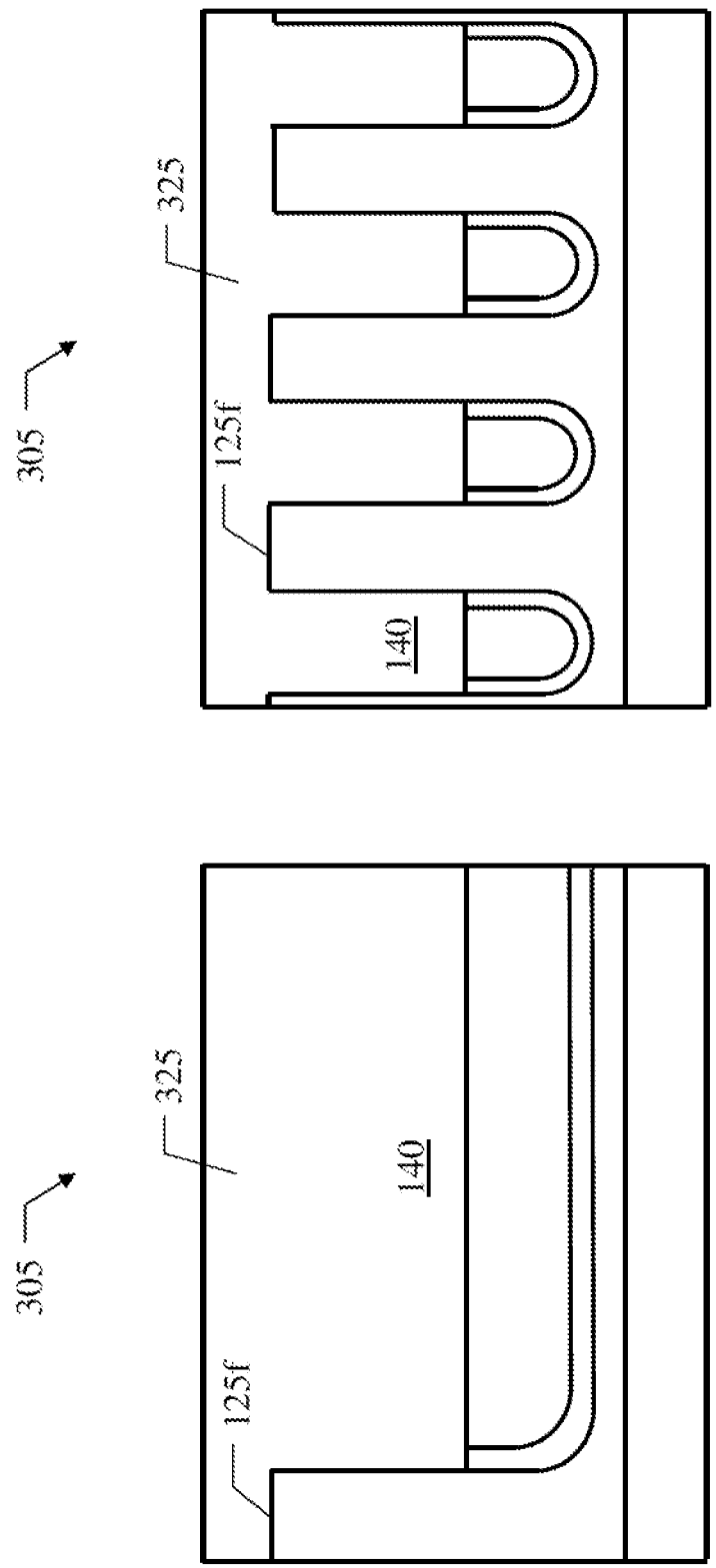

Moving to FIG. 2F, a layer of silicon oxide 325 is deposited onto the wafer 305, so as to fill the gate trenches 140 and to cover the front surface 125f.

Figure 2G:
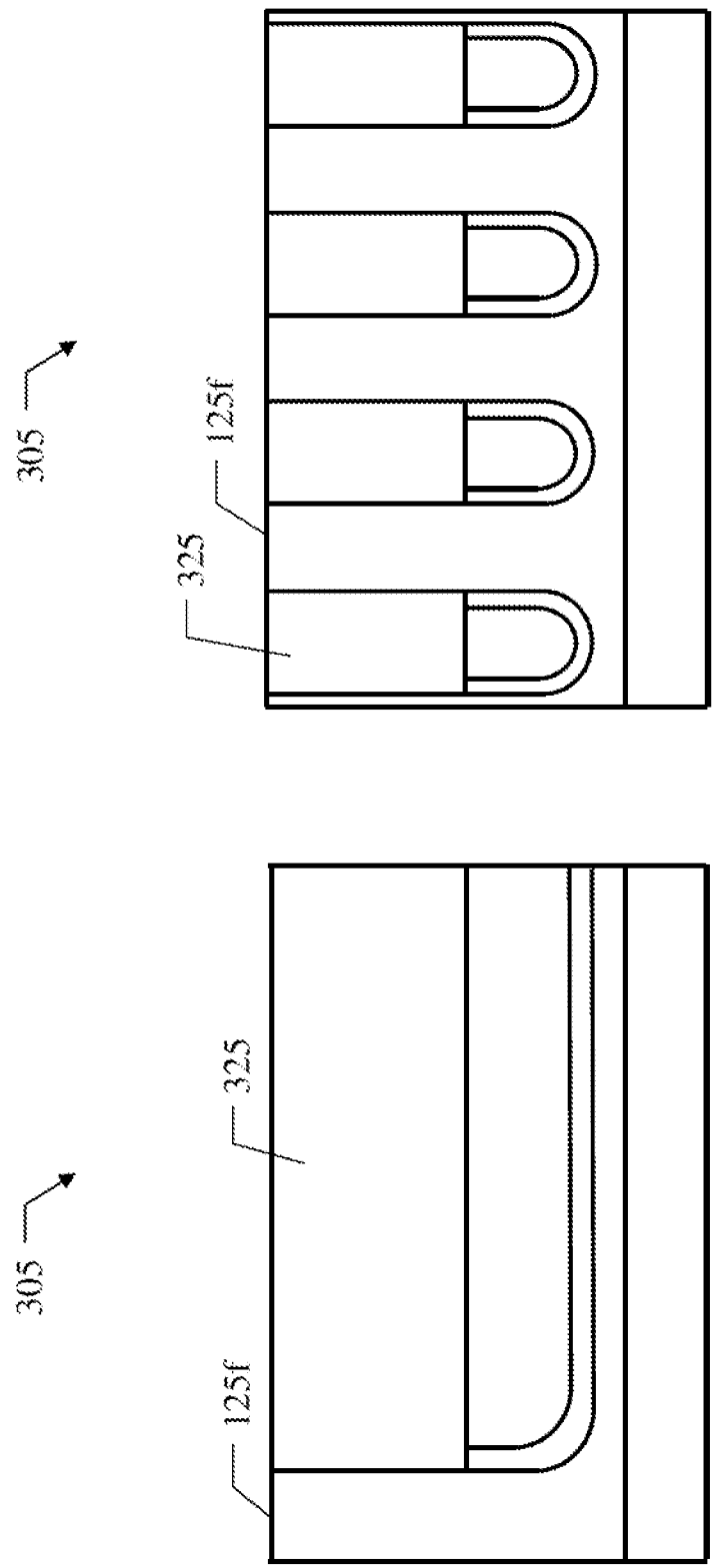

Moving to FIG. 2G, the wafer 305 is planarized (for example, with a Chemical Mechanical Polishing, CMP, step) to remove an excess of the layer of silicon oxide 325 on the front surface 125f.

Figure 2H:
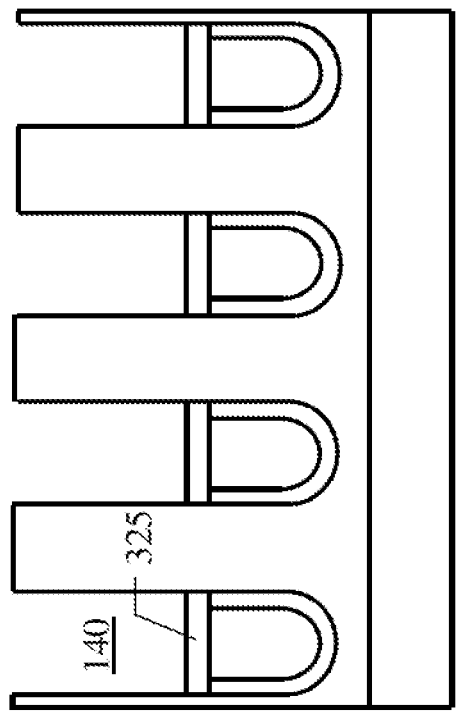

Moving to FIG. 2H, the layer of silicon oxide 325 is etched (for example, with a dry etching step) to recess into the gate trenches 140, down to remain only in corresponding portions at a bottom thereof with a relatively high thickness (for example, 100-200 nm).

Figure 2I:
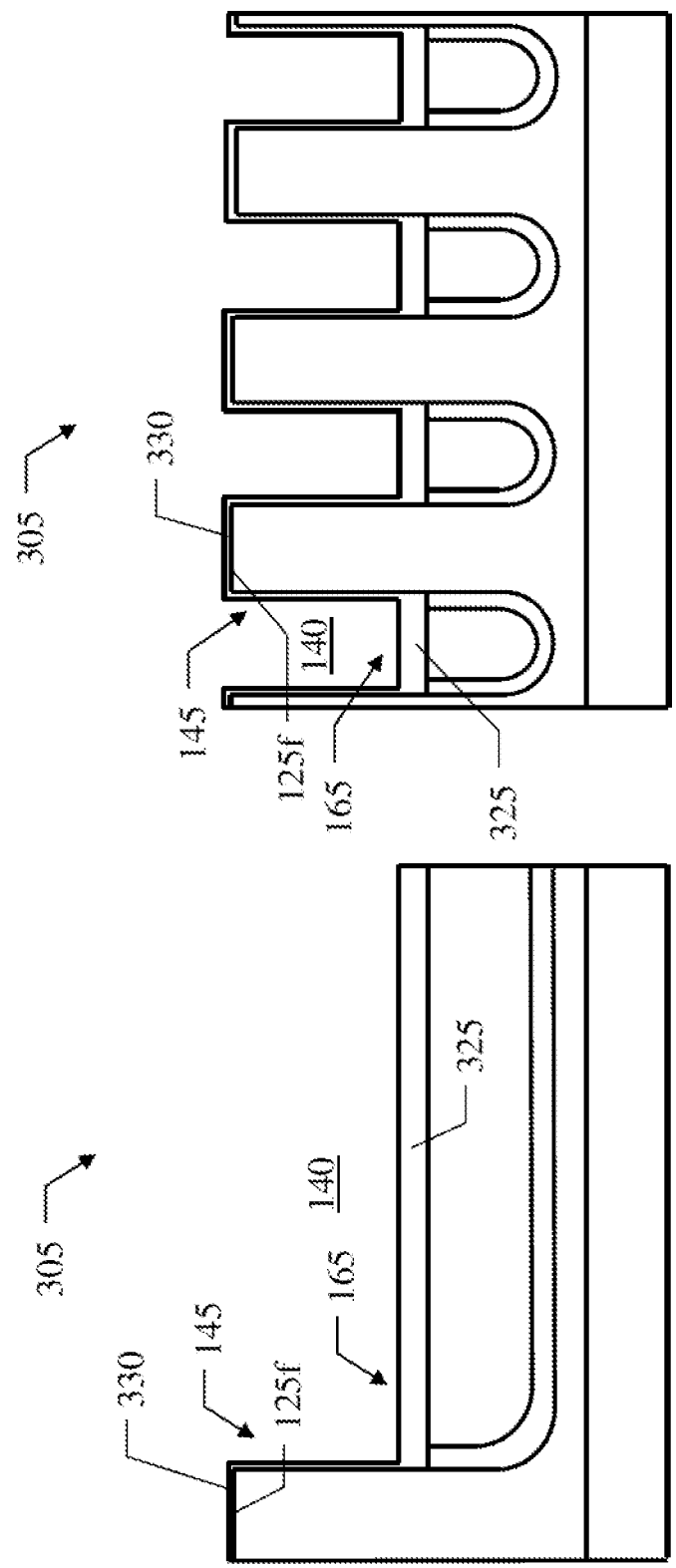

Moving to FIG. 2I, another layer of silicon oxide 330 is grown onto the wafer 305, i.e., the front surface 125f, the lateral surface of the upper portions of the gate trenches 140 and the portions of the layer of silicon oxide 325 (for example, with a thermal oxidation step). Particularly, corresponding portions of the layer of silicon oxide 330 that coat the upper portions of the gate trenches 140 defines the corresponding gate insulating layers 145, whereas corresponding portions of the layer of silicon oxide 330 that add to the portions of the layer of silicon oxide 325 in the gate trenches 140 (slightly increasing their thickness) define the corresponding splitting insulating layers 165. The layer of silicon oxide 330 has a relatively low thickness (for example, 30-50 nm), in any case far lower than the thickness of the splitting insulating layers 165 (130-250 nm in the example at issue).

Figure 2J:
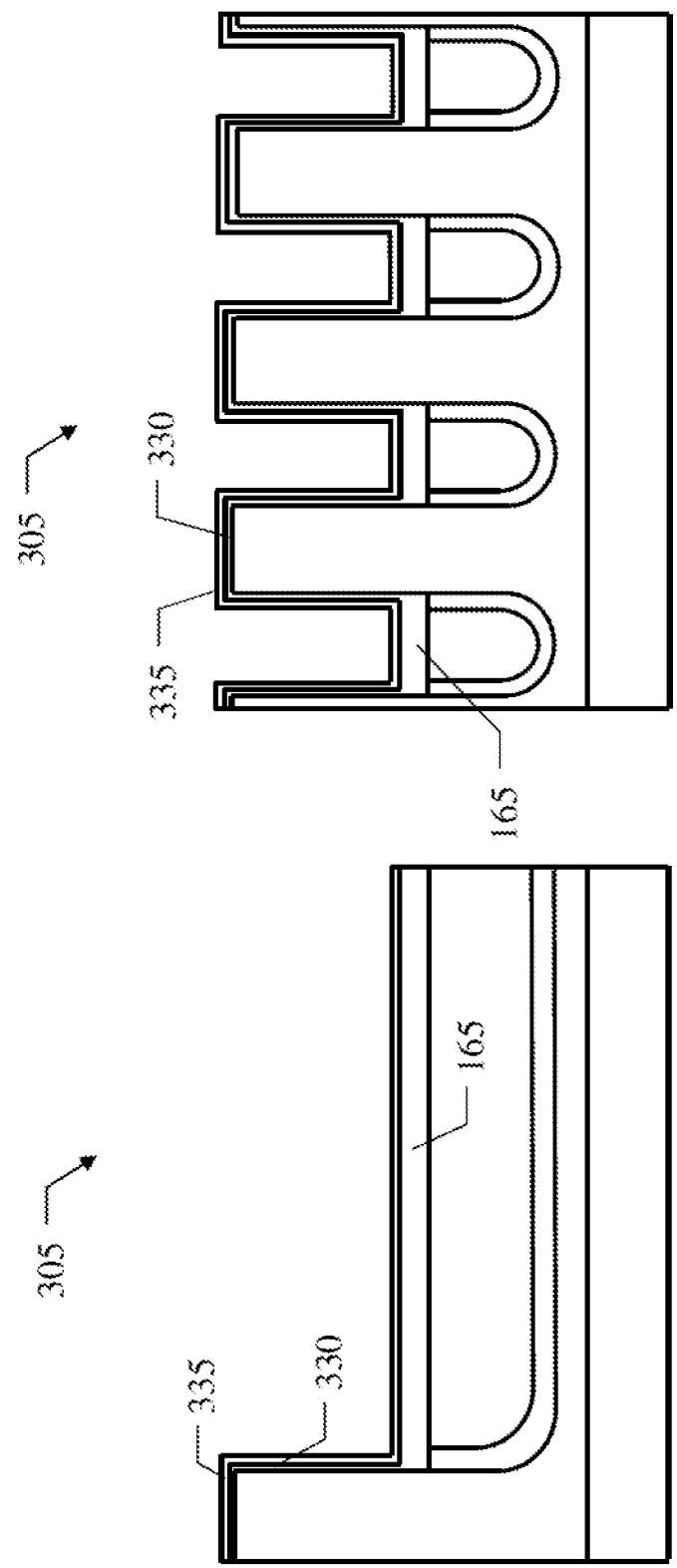

Moving to FIG. 2J, in the solution according to an embodiment of the present disclosure, a (sacrificial) layer of a material different from the one of the layer of silicon oxide 330 is formed onto the wafer 305, i.e., the layer of silicon oxide 330 both where alone and when contributing to form the splitting insulating layers 165. For example, a layer of an auxiliary (electrically) insulating material, such as a layer of silicon nitride ($Si_3N_4$) 335 is deposited. The layer of silicon nitride 335 has a (relatively) low thickness (for example, 70-100 nm). Particularly, a total thickness of a passing insulating layer formed by the superimposed layer of silicon oxide 330 (alone) and layer of silicon nitride 335 is (possibly strictly) lower than an implantation threshold ensuring that the passing insulating layer 330,335 does not substantially stop any implantation of dopants through it; conversely, a total thickness of a blocking insulating layer formed by the superimposed splitting insulating layers 165 and layer of silicon nitride 335 is higher than the implantation threshold, so as to ensure that the blocking insulating layer 165,335 substantially stops any implantation of dopants through it. For example, the implantation threshold is 150-250 nm, preferably 180-220 nm and still more preferably 190-210 nm, such as 200 nm; the thickness of the passing insulating layer 330,335 is 0.4-0.9, preferably 0.5-0.8 and still more preferably 0.6-0.7, such as 0.65 times the implantation threshold, whereas the thickness of the blocking insulating layer 165,335 is 1.3-2.5, preferably 1.4-2.0 and still more preferably 1.5-1.8, such as 1.7 times the implantation threshold.

Figure 2K:
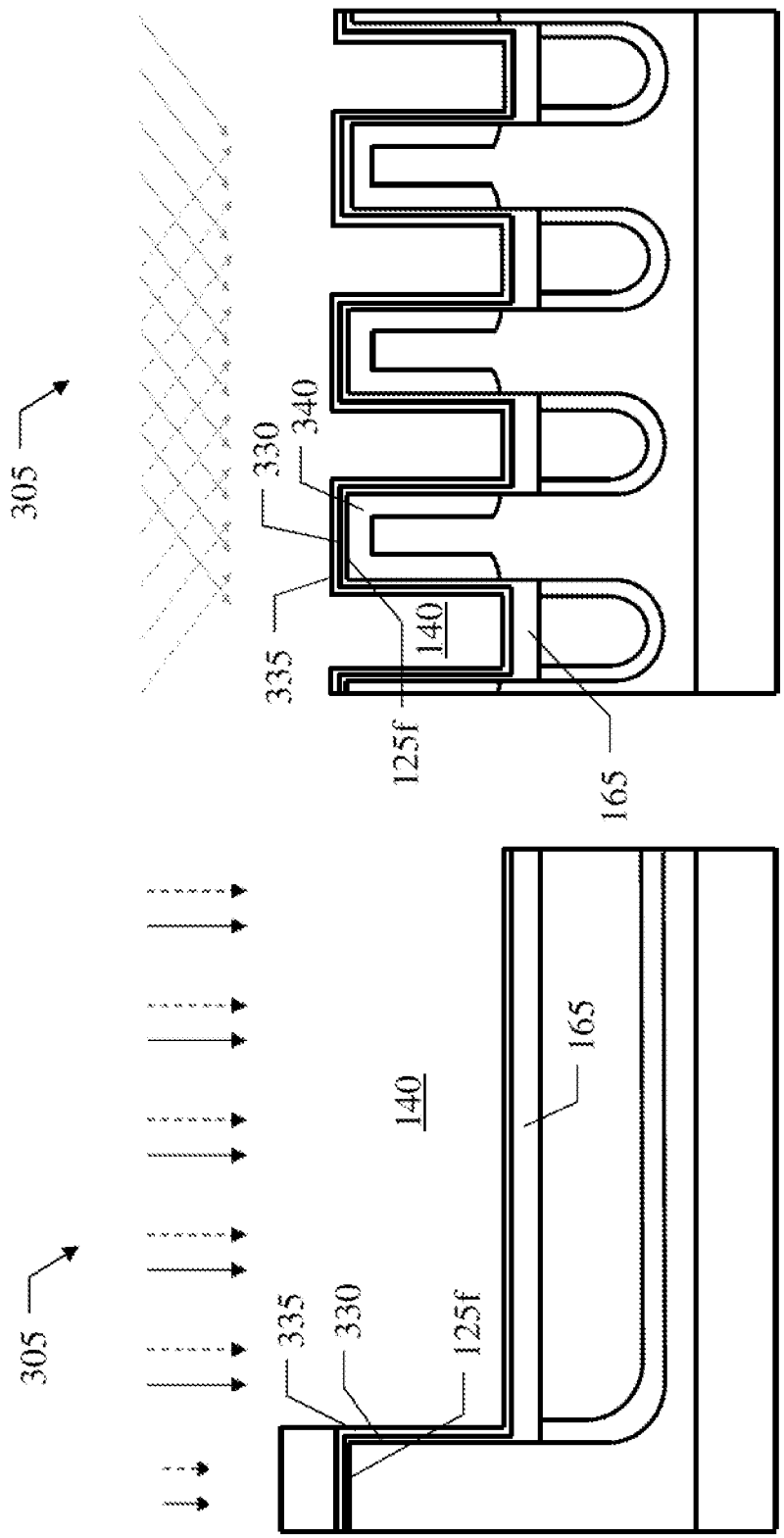

Moving to FIG. 2K, two (ionic) implantation steps of dopants of P-type (for example, boron) are performed in succession in the area of the trench gates 140 (with the rest of the wafer 305 suitably masked). In both cases, the dopants are shot into the wafer 305 along corresponding implantation directions that are tilted (not perpendicular) with respect to the front surface 125f. Particularly, in any plane perpendicular to the front surface 125f and to the axes of the trench gates 140 (to the right in the figure) the implantation directions are symmetric to a normal to the front surface 125f; for example, the implantation directions form opposite angles with the normal equal to ±45°-60°, preferably ±47-58°, and still more preferably ±49-56°, such as ±51-54°. In view of the above, the dopants only cross the (thinner) superimposed layer of silicon oxide 330 and layer of silicon nitride 335, whereas they are blocked by the (thicker) superimposed splitting insulating layers 165 and layer of silicon nitride 335. As a consequence, corresponding regions of boron 340 are implanted below the front surface 125f and the lateral surface of the upper portions of the gate tranches 140 (and then aligned in depth with the layer of silicon nitride 335).

Figure 2L:
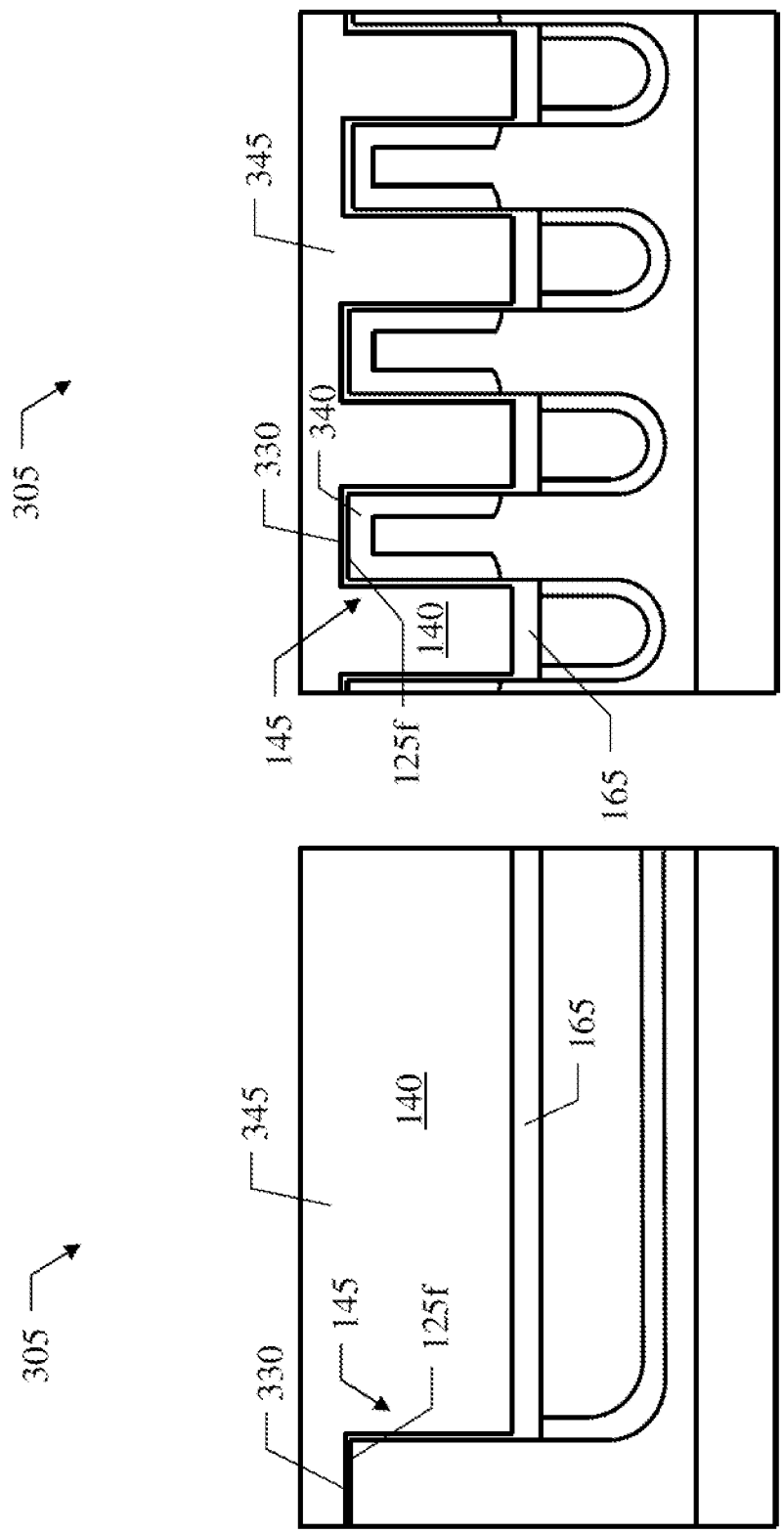

Moving to FIG. 2L, an etching step is performed being selective to act on the material of the layer of silicon nitride but not on the material of the layer of silicon oxide 330 (for example, based on phosphoric acid). As a result, the layer of silicon nitride is removed without affecting the layer of silicon oxide 330 (and then the thickness of the gate insulating layers 145 and of the splitting insulating layers 165). A (further) layer of doped polysilicon 345 of N+ type is deposited onto the wafer 305, i.e., the portion of the layer of silicon oxide 330 on the front surface 125f, the gate insulating layers 145 and the splitting insulating layers 165, so as to fill the (coated) upper portion of the gate trenches 140 and to cover the (coated) front surface 125f. In view of the above, the layer of doped polysilicon 345 is aligned in depth with the regions of boron 340 (apart from the thickness of the layer of silicon nitride that has been removed).

Figure 2M:
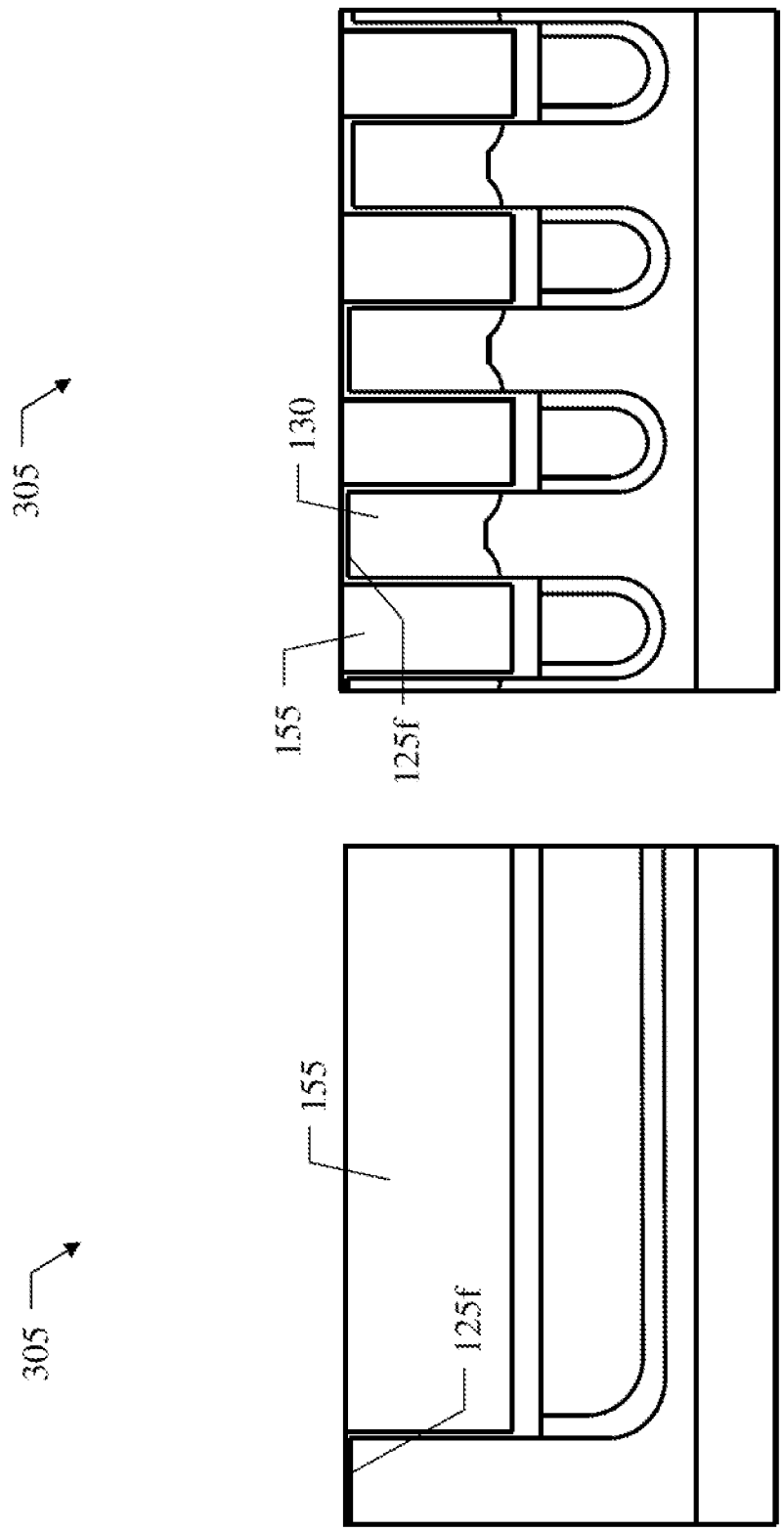

Moving to FIG. 2M, the wafer 305 is planarized (for example, with a Chemical Mechanical Polishing, CMP, step) to remove an excess of the layer of doped polysilicon on the front surface 125f, thereby leaving the gate regions 155. The regions of boron are now diffused so as to obtain the body region 130. In view of the above, the gate regions 155 are substantially self-aligned in-depth with the body region 130 (apart from the thickness of the layer of silicon nitride that has been removed).

The process then continues as usual to obtain the integrated device 100 shown in FIG. 1. Particularly, the source regions 135 are formed with an (ionic) implantation step of dopants of N type (for example, arsenic) through a photo-resist mask (then stripped), followed by a thermal diffusion step. A relatively thick layer of silicon oxide is grown with a thermal oxidation step onto the wafer to form the protective layer 175. Corresponding windows for the source contact 180, the gate contact 185 and the contact of the field plates 160 (not shown in the figure) are opened in the protective layer 175 by etching it through a photo-resist mask, then stripped. A layer of metal (for example, tungsten) is deposited onto the wafer, so as to fill the windows and to cover the (coated) front surface 125*f*, and it is then planarized (for example, with a CMP step) to remove an excess of the metal on the protective layer 175. A further layer of metal (for example, copper) is deposited onto the wafer and it is then etched through a photo-resist mask, then stripped, so as to define the source contact 180, the gate contact 185 and the contact of the field plates 160. A layer of metal (for example, copper) is deposited onto the back surface 125*b* of the wafer to form the drain contact 170.

The integrated device 100 so obtained (with the gate regions 155 self-aligned in depth with the body region 130) may be recognized because of peculiar features thereof being due to the tilted implantation steps. Indeed, in this case the body region 130 has a bottom surface within the die 110 with a concavity between each pair of adjacent trench gates 140, i.e., curved inwards it (towards the front surface 125*f*); for example, a distance between its deepest point in the die 110 (close to the trench gates 140) and its shallowest point in the die 110 (in the middle between the trench gates 140) is about 2-10% of a thickness of the body region 130. In addition or in alternative, the integrated device 100 may be recognized by analyzing it with a Secondary-Ion Mass Spectrometry (SIMS) technique; indeed, in this way it is possible to point out the typical dopant profile due to the implantation process (i.e., with its concentration increasing towards a maximum value and then decreeing) moving obliquely inwards the die 110 from the front surface 125*f* and the lateral surface of the (upper portions) of the trench gates 140.

Figure 3:
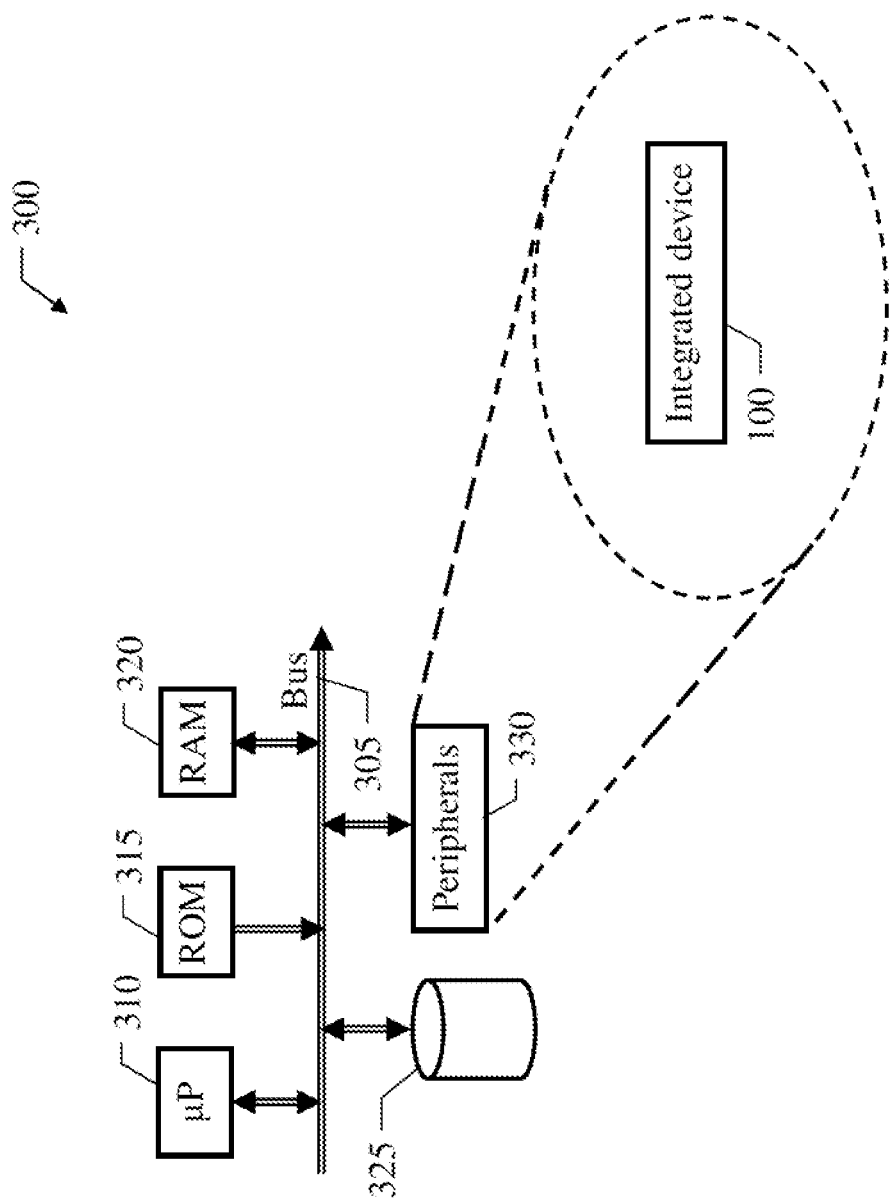

With reference now to FIG. 3, a schematic block diagram is shown of a system 300 incorporating the integrated device according to an embodiment of the present disclosure.

The system 300 (for example, a control unit for automotive applications) comprises several components that are connected among them through a bus structure 305 (with one or more levels). Particularly, one or more microprocessors (μP) 310 provide a logic capability of the system 300; a non-volatile memory (ROM) 315 stores basic code for a bootstrap of the system 300 and a volatile memory (RAM) 320 is used as a working memory by the microprocessors 310. The system has a mass-memory 325 for storing programs and data (for example, a flash E²PROM). Moreover, the system 300 comprises a number of controllers of peripheral, or Input/Output (I/O), units, 330 (such as a Wi-Fi WNIC, a Bluetooth transceiver, a GPS receiver, an accelerometer, a gyroscope and so on). Particularly, one or more of the peripherals 330 each comprises the integrated device 100.

Modifications

Naturally, in order to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. Particularly, different embodiments of the present disclosure may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. Moreover, items presented in a same group and different embodiments, examples or alternatives are not to be construed as de facto equivalent to each other (but they are separate and autonomous entities). In any case, each numerical value should be read as modified according to applicable tolerances; particularly, unless otherwise indicated, the terms "substantially", "about", "approximately" and the like should be understood as within 10%, preferably 5% and still more preferably 1%. Moreover, each range of numerical values should be intended as expressly specifying any possible number along the continuum within the range (comprising its end points). Ordinal or other qualifiers are merely used as labels to distinguish elements with the same name but do not by themselves connote any priority, precedence or order. The terms include, comprise, have, contain, involve and the like should be intended with an open, non-exhaustive meaning (i.e., not limited to the recited items), the terms based on, dependent on, according to, function of and the like should be intended as a non-exclusive relationship (i.e., with possible further variables involved), the term a/an should be intended as one or more items (unless expressly indicated otherwise), and the term means for (or any means-plus-function formulation) should be intended as any structure adapted or configured for carrying out the relevant function.

For example, an embodiment provides a process for manufacturing an integrated device. However, the integrated device may be manufactured with any technologies, with masks being different in number and in type, or with other process steps/parameters. Moreover, the above-described solution may be part of the design of an integrated device. The design may also be created in a hardware description language; moreover, if the designer does not manufacture chips or masks, the design may be transmitted by physical means to others.

In an embodiment, the integrated device comprises at least one MOS transistor integrated on a die of semiconductor material of a first type of conductivity having a main surface. However, the integrated device may be of any type (see below) and integrated on a die of any type (for example, an epitaxial layer grown on a substrate, a monocrystalline substrate, a SOI and so on) and of any semiconductor material (for example, silicon, germanium, with any type and concentration of dopants, and so on).

In an embodiment, the process comprises forming one or more gate trenches extending from the main surface into the die. However, the gate trenches may be in any number and of any shape, size and depth (for example, with a U section in a UMOS, a V section in a VMOS and so on).

In an embodiment, the process comprises coating the gate trenches with an electrically insulating material to obtain corresponding coated internal portions of the gate trenches (being coated with corresponding separation insulating layers) and corresponding coated external portions of the gate trenches (being coated with corresponding gate insulating layers). However, the internal/external portions of the gate trenches may have any depth (in either relative or absolute terms); moreover, the separation/gate insulation layers may be of any material (either the same or different to each other, such as silicon oxide, silicon nitride, TEOS and so on), any thickness (in either relative or absolute terms) and they may formed in any way (for example, with one or more growing steps and/or deposition steps, either selective or not, with possible etching steps and so on).

In an embodiment, the process comprises filling the coated inner portions of the gate trenches with electrically conductive material forming corresponding field plates. However, the field plates may be of any material (for example, polysilicon, metal and so on) and they may be formed in any way (for example, with deposition, planarization and etching steps, deposition and etching steps, selective deposition step and so on).

In an embodiment, the process comprises covering the field plates with corresponding splitting insulating layers of electrically insulating material. However, the splitting insulating layers may be of any material (either the same or different with respect to the separation/gate insulating layers), any thickness (either the same or different with respect to the separation insulating layer) and they may be formed in any way (for example, with a deposition step, a growing step, either selective or followed by an etching step, and so on).

In an embodiment, the process comprises implanting dopants of a second type of conductivity into the die from the main surface. However, the dopants may be of any type (for example, boron, arsenic and so on) and they may be implanted in any way (for example, with any energy, length and so on).

In an embodiment, the dopants are implanted along one or more implantation directions being tilted with respect to the front surface. However, the dopants may be implanted along any number of implantation directions forming any non-null angle with the front surface.

In an embodiment, the dopants are implanted selectively by passing in an implantation zone (at the front surface and a lateral surface of the external portions of the gate trenches) and being blocked in a blocking zone (at the splitting insulating layers). However, this selective implantation may be obtained in any way (for example, with insulating layers of different thickness, a mask and so on).

In an embodiment, the process comprises diffusing the dopants being implanted to form a body region. However, the dopants may be diffused in any way (for example, with any temperature, length and so on).

In an embodiment, the process comprises filling the coated external portions of the gate trenches with electrically conductive material forming corresponding gate regions (thereby being substantially self-aligned in depth from the main surface with the body region). However, the gate regions may be of any material (for example, either the same or different with respect to the field plates) and they may be formed in any way (for example, with deposition and planarization steps, selective deposition step and so on); moreover, the gate regions and the body region may be self-aligned with any tolerance (for example, up to 10%, preferably 5% and still more preferably 3%, such as 2% of the depth of the body region).

Further embodiments provide additional advantageous features, which may however be omitted at all in a basic implementation.

Particularly, in an embodiment the process comprises implanting the dopants along a first one and a second one of the implantation directions forming a first angle and a second angle, respectively, with a normal to the front surface having opposite values. However, the possibility is not excluded of using more implantation directions, even not symmetric (for example, with the addition of an implantation direction perpendicular to the front surface).

In an embodiment, the first angle and the second angle are ±51-54°. However, different angles are contemplated.

In an embodiment, the process comprises implanting the dopants selectively by passing through a passing insulating layer of electrically insulating material at the passing zone and being blocked by a blocking insulating layer of electrically insulating material at the blocking zone having a thickness being lower and higher, respectively, than an implantation threshold. However, the passing/blocking insulating layers may be formed in any way (for example, via a sacrificial insulating layer, directly and so on) and they may have any thickness (in either absolute or relative terms).

In an embodiment, the implantation threshold is 200 nm. However, different values of the implantation threshold are contemplated (for example, varying according to the energy, the length and so on of the implantation steps).

In an embodiment, the process comprises forming an auxiliary insulating layer of electrically insulating material on the implantation zone over the gate insulating layers and on the blocking zone over the splitting insulating layers to obtain the passing insulating layer and the blocking insulating layer, respectively. However, the auxiliary insulating layer may be of any type (for example, of any material, thickness and so on) and it may be formed in any way (for example, deposited, grown and so on).

In an embodiment, the process comprises removing the auxiliary insulating layer after said implanting the dopants. However, the auxiliary insulating layer may be removed in any way (for example, with a wet etching step, a dry etching step and so on), down to none.

In an embodiment, the electrically insulating material of the auxiliary insulating layer is different from the electrically insulating material of the gate insulating layers and of the splitting insulating layers. However, the materials may be of any type (even the same, at least in part).

In an embodiment, the process comprises removing the auxiliary insulating layer after said implanting the dopants by a selective etching acting on the electrically insulating material of the auxiliary insulating layer and not acting on the electrically insulating material of the gate insulating layers and of the splitting insulating layers. However, the selective etching may be performed in any way (for example, with any selective solutions) or in a different way (for example, via a corresponding mask).

In an embodiment, the electrically insulating material of the auxiliary insulating layer is silicon nitride and the electrically insulating material of the gate insulating layers and of the splitting insulating layers is silicon oxide. However, the use of different materials is contemplated.

Generally, similar considerations apply if the same solution is implemented with an equivalent method (by using similar steps with the same functions of more steps or portions thereof, removing some non-essential steps or adding further optional steps); moreover, the steps may be performed in a different order, concurrently or in an interleaved way (at least in part).

An embodiment provides an integrated device comprising at least one MOS transistor integrated on a die of semiconductor material. However, the integrated device may be of any type (for example, in raw wafer form, as a bare die, in a package, and so on) and comprising any number and type of MOS transistors (for example, NMOS, PMOS, of power/signal/mixed type, with a cellular/simple structure and so on).

In an embodiment, the integrated device is manufactured by the above-mentioned process. However, the integrated device may be recognized by any number and type of corresponding peculiar features (for example, the concavities of the body region, its dopant profile and so on).

An embodiment provides a system comprising at least one integrated device as above. However, the same structure may be integrated with other circuits in the same chip; the chip may also be coupled with one or more other chips, it may be mounted in intermediate products or it may be used in complex apparatus. In any case, the resulting system may be of any type (for example, for use in automotive applications, smartphones, computers and so on) and it may comprise any number of these integrated devices.

Generally, similar considerations apply if the integrated device and the system each has a different structure or comprises equivalent components (for example, of different materials) or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

A process for manufacturing an integrated device (100) may be summarized as including at least one MOS transistor (105) integrated on a die (110) of semiconductor material of a first type of conductivity having a main surface (125f), wherein the process includes forming one or more gate trenches (140) extending from the main surface (125f) into the die (110), coating the gate trenches (140) with an electrically insulating material to obtain corresponding coated internal portions of the gate trenches (140) being coated with corresponding separation insulating layers (150) and corresponding coated external portions of the gate trenches (140) being coated with corresponding gate insulating layers (145), filling the coated inner portions of the gate trenches (140) with electrically conductive material forming corresponding field plates (160), covering the field plates (160) with corresponding splitting insulating layers (165) of electrically insulating material, implanting dopants of a second type of conductivity into the die (110) from the main surface (125f) along one or more implantation directions being tilted with respect to the front surface (125f), the dopants being implanted selectively by passing in an implantation zone at the front surface (125f) and a lateral surface of the external portions of the gate trenches (140) and being blocked in a blocking zone at the splitting insulating layers (165), diffusing the dopants being implanted to form a body region (130), and filling the coated external portions of the gate trenches (140) with electrically conductive material forming corresponding gate regions (155) thereby being substantially self-aligned in depth from the main surface (125f) with the body region (130).

The process may include implanting the dopants along a first one and a second one of the implantation directions forming a first angle and a second angle, respectively, with a normal to the front surface (125f) having opposite values.

The first angle and the second angle may be ±51-54°.

The process may include implanting the dopants selectively by passing through a passing insulating layer (145, 335) of electrically insulating material at the passing zone and being blocked by a blocking insulating layer (160,335) of electrically insulating material at the blocking zone having a thickness being lower and higher, respectively, than an implantation threshold.

The implantation threshold may be 200 nm.

The process may include forming an auxiliary insulating layer (335) of electrically insulating material on the implantation zone over the gate insulating layers (145) and on the blocking zone over the splitting insulating layers (165) to obtain the passing insulating layer (145,335) and the blocking insulating layer (160,335), respectively, and removing the auxiliary insulating layer (335) after said implanting the dopants.

The electrically insulating material of the auxiliary insulating layer (335) may be different from the electrically insulating material of the gate insulating layers (145) and of the splitting insulating layers (165), the process may include removing the auxiliary insulating layer (335) after said implanting the dopants by a selective etching acting on the electrically insulating material of the auxiliary insulating layer (335) and not acting on the electrically insulating material of the gate insulating layers (145) and of the splitting insulating layers (165).

The electrically insulating material of the auxiliary insulating layer (335) may be silicon nitride and the electrically insulating material of the gate insulating layers (145) and of the splitting insulating layers (165) is silicon oxide.

An integrated device (100) may be summarized as including at least one MOS transistor (105) integrated on a die (110) of semiconductor material, the integrated device (100) being manufactured by the process.

A system (300) may be summarized as including at least one integrated device (100).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing an integrated device including at least one MOS transistor integrated on a die of semiconductor material of a first type of conductivity having a main surface, the process comprising:
   forming one or more gate trenches extending from the main surface into the die;
   coating the gate trenches with an electrically insulating material to obtain corresponding coated internal portions of the gate trenches being coated with corresponding separation insulating layers;
   filling the coated internal portions of the gate trenches with electrically conductive material forming corresponding field plates;
   forming a layer of electrically insulating material in the gate trenches to obtain corresponding splitting insulating layers of electrically insulating material on the field plates and corresponding coated upper portions of the gate trenches that are coated with corresponding gate insulating layers;
   forming an auxiliary insulating layer of electrically insulating material on the gate insulating layers and the splitting insulating layers to obtain a passing insulating layer and a blocking insulating layer, respectively;

implanting dopants of a second type of conductivity into the die from the main surface along one or more implantation directions being tilted with respect to the main surface, the dopants being implanted selectively by passing though the passing insulating layer in an implantation zone at the gate insulating layers and being blocked by the blocking insulating layer in a blocking zone at the splitting insulating layers;

diffusing the dopants being implanted to form a body region;

removing the auxiliary insulating layer after the implanting of the dopants; and filling the coated upper portions of the gate trenches with electrically conductive material forming corresponding gate regions thereby being substantially self-aligned in depth from the main surface with the body region, surfaces of the gate regions being coplanar with the main surface.

2. The process according to claim 1, wherein the implanting the dopants of the second type of conductivity comprises:

implanting the dopants along a first one and a second one of the implantation directions forming a first angle and a second angle, respectively, with a normal to the main surface having opposite values.

3. The process according to claim 2, wherein the first angle and the second angle are within a range of ±51° to ±54°.

4. The process according to claim 1, wherein
the passing insulating layer has a thickness lower than an implantation threshold, and
the blocking insulating layer has a thickness higher than the implantation threshold.

5. The process according to claim 4, wherein the implantation threshold is 200 nm.

6. The process according to claim 1, wherein the electrically insulating material of the auxiliary insulating layer is different from the electrically insulating material of the gate insulating layers and of the splitting insulating layers, the process further comprising:

removing the auxiliary insulating layer after the implanting the dopants by a selective etching acting on the electrically insulating material of the auxiliary insulating layer and not acting on the electrically insulating material of the gate insulating layers and of the splitting insulating layers.

7. The process according to claim 6, wherein the electrically insulating material of the auxiliary insulating layer is silicon nitride and the electrically insulating material of the gate insulating layers and of the splitting insulating layers is silicon oxide.

8. A method, comprising:

forming a gate trench extending into a semiconductor die from a first surface, the semiconductor die having a first type of conductivity;

forming a separation insulation layer on walls of the semiconductor die in the gate trench, the separation insulation layer having an upper surface spaced apart from the first surface of the semiconductor die;

forming a field plate by forming a doped polysilicon layer in the gate trench and laterally between sidewalls of the separation insulation layer in the gate trench, the field plate having an upper surface substantially coplanar with the upper surface of the separation insulation layer;

forming a splitting insulating layer of electrically insulating material on the field plate;

forming a gate insulating layer of electrically insulating material on the walls of the semiconductor die between the upper surface of the separation insulation layer and the first surface;

forming an auxiliary insulating layer of electrically insulating material on the gate insulating layer and the splitting insulating layer to obtain a passing insulating layer and a blocking insulating layer, respectively;

forming a body region by implanting dopants of a second type of conductivity into the semiconductor die from the first surface along one or more implantation directions being tilted with respect to the first surface, the dopants being implanted selectively by passing through the passing insulating layer in an implantation zone at the gate insulating layer and being blocked by the blocking insulating layer in a blocking zone at the splitting insulating layer;

removing the auxiliary insulating layer after the implanting of the dopants; and forming a gate region by filling the gate trench with an electrically conductive material, the electrically conductive material extending from an upper surface of the splitting insulating layer to a level that is above a level of the first surface, the gate region being substantially self-aligned in depth from a main surface with the body region.

9. The method of claim 8, wherein forming the splitting insulating layer includes forming a first dielectric layer on the upper surfaces of the separation insulation layer and the field plate in the gate trench.

10. The method of claim 9, further wherein forming the gate insulating layer includes forming a second dielectric layer on the walls of the semiconductor die between the upper surface of the separation insulation layer and the first surface.

11. The method of claim 10, wherein forming the splitting insulating layer includes forming the second dielectric layer on the first dielectric layer overlying the upper surfaces of the separation insulation layer and the field plate in the gate trench.

12. The method of claim 11, wherein the electrically insulating material of the auxiliary insulating layer is different from the materials of the second dielectric layer of the gate insulating layer and of the first dielectric layer of the splitting insulating layer, the method further comprising:

removing the auxiliary insulating layer after the implanting the dopants by a selective etching acting on the electrically insulating material of the auxiliary insulating layer.

13. The method according to claim 12, wherein the electrically insulating material of the auxiliary insulating layer is silicon nitride and the first and second dielectric layers are silicon oxide layers.

14. The method of claim 8, wherein
the passing insulating layer has a thickness lower than an implantation threshold, and
the blocking insulating layer has a thickness higher than the implantation threshold.

15. The method of claim 8, wherein the implanting the dopants of the second type of conductivity comprises:

implanting the dopants along a first one and a second one of the implantation directions forming a first angle and a second angle, respectively, with a normal to the first surface having opposite values.

16. The method of claim 15, wherein the first angle and the second angle are within a range of ±51° to ±54°.

17. A method, comprising:
  forming a plurality of trenches in a semiconductor die having a first type of conductivity;
  forming a first insulating layer on the semiconductor die and in the plurality of trenches;
  forming a plurality of field plates in the plurality of trenches, respectively, by forming a first conductive layer on the first insulating layer and in the plurality of trenches;
  removing portions of the first insulating layer on sidewall surfaces of the plurality of trenches such that surfaces of the first insulating layer and surfaces of the plurality of field plates form a plurality of planar surfaces in the plurality of trenches, respectively;
  forming a second insulating layer on the plurality of planar surfaces;
  forming a third insulating layer on the second insulating layer, in the plurality of trenches, and on portions of the semiconductor die that separate the plurality of trenches from each other, the third insulating layer being a first material;
  forming a fourth insulating layer on the third insulating layer and in the plurality of trenches, the fourth insulating layer being a second material different from the first material;
  forming a plurality of body regions in semiconductor die by implanting dopants of a second type of conductivity into the portions of the semiconductor die that separate the plurality of trenches from each other; and
  forming a plurality of gate regions in the plurality of trenches by forming a second conductive layer on the first conductive layer and in the plurality of trenches.

18. The method of claim 17 wherein the plurality of planar surfaces are coplanar.

* * * * *